US008311258B2

(12) United States Patent
Lin et al.

(10) Patent No.: US 8,311,258 B2
(45) Date of Patent: Nov. 13, 2012

(54) HEADSET

(75) Inventors: You-Ruei Lin, Tu-Cheng (TW); Wen-Chin Chang, Tu-Cheng (TW)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 917 days.

(21) Appl. No.: 12/382,205

(22) Filed: Mar. 11, 2009

(65) Prior Publication Data

US 2010/0232636 A1 Sep. 16, 2010

(51) Int. Cl.

| | |
|---|---|
| ***H04R 25/02*** | (2006.01) |
| ***H04R 1/02*** | (2006.01) |
| ***H04R 1/22*** | (2006.01) |
| ***H05K 5/02*** | (2006.01) |
| *H04R 25/00* | (2006.01) |
| *H04R 1/00* | (2006.01) |
| *H05K 5/00* | (2006.01) |

(52) U.S. Cl. ........ 381/370; 381/371; 381/345; 381/349; 181/199; 181/156

(58) Field of Classification Search .................. 381/370, 381/371, 372, 373, 345, 351, 353, 349, 161; 181/199, 148, 156, 145, 129, 130, 135, 219, 181/271, 277, 278

See application file for complete search history.

(56) References Cited

U.S. PATENT DOCUMENTS 2,053,995 A * 9/1936 Hoey ............................ 128/865
2,073,747 A * 3/1937 Koroncai et al. ............. 181/148
2,123,442 A * 7/1938 Stone ............................ 181/148
2,403,699 A * 7/1946 Wilson .......................... 181/241
3,047,090 A * 7/1962 Pruden .......................... 181/152
3,110,356 A * 11/1963 Mendelson ................... 181/130
3,702,123 A * 11/1972 Macken et al. ............... 181/135
3,751,608 A * 8/1973 Weingartner ................. 381/372
3,800,101 A * 3/1974 Milani ........................... 381/324
3,826,333 A * 7/1974 Buckwalter ................... 181/153
3,940,721 A * 2/1976 Kojima et al. ................ 333/233
3,999,020 A * 12/1976 Bastiaans et al. ............. 381/372
4,027,116 A * 5/1977 Nakamura .................... 381/346
4,482,026 A * 11/1984 Stehlin, Jr. .................... 181/152
4,761,625 A * 8/1988 Sharma ......................... 333/209
4,889,208 A * 12/1989 Sugihara ....................... 181/148
4,924,502 A * 5/1990 Allen et al. ...................... 381/72
5,082,084 A * 1/1992 Ye-Ming ....................... 181/153
5,304,747 A * 4/1994 Hale, II .......................... 181/156
5,332,871 A * 7/1994 Carrigan ....................... 181/135
5,418,338 A * 5/1995 Kim ............................... 181/199

(Continued)

FOREIGN PATENT DOCUMENTS

JP 2011176725 A * 9/2011

*Primary Examiner* — Edgardo San Martin
(74) *Attorney, Agent, or Firm* — Cheng-Ju Chiang

(57) ABSTRACT

A headset includes a housing having a first wall with at least one sound hole formed thereon, a loudspeaker unit disposed in the housing and adjacent to the sound hole, a blocking component mounted in the housing and capable of slidably moving towards and backwards the first wall to form an adjunctive chamber therebetween, and an adjustive component rotatably mounted to the housing. The adjustive component is connected with the blocking component in a way of screw link in order to drive the blocking component to move towards and backwards the first wall when the adjustive component is driven to rotate.

6 Claims, 3 Drawing Sheets

U.S. PATENT DOCUMENTS

| | | | | |
|---|---|---|---|---|
| 5,475,189 | A * | 12/1995 | Field et al. | 181/241 |
| 5,721,401 | A * | 2/1998 | Sim | 181/148 |
| 6,079,515 | A * | 6/2000 | Newman | 181/156 |
| 6,148,821 | A * | 11/2000 | Falco | 128/864 |
| 6,292,573 | B1 * | 9/2001 | Zurek et al. | 381/386 |
| 6,732,510 | B2 * | 5/2004 | Ciray | 60/312 |
| 6,826,287 | B2 * | 11/2004 | Myers | 381/373 |
| 6,862,360 | B2 * | 3/2005 | Tsai | 381/351 |
| 7,116,795 | B2 * | 10/2006 | Tuason et al. | 381/386 |
| 7,337,877 | B2 * | 3/2008 | Goenka et al. | 181/250 |
| 7,450,733 | B2 * | 11/2008 | Suprapmo et al. | 381/337 |
| 7,697,709 | B2 * | 4/2010 | Mei et al. | 381/379 |
| 8,055,007 | B2 * | 11/2011 | Kim | 381/382 |
| 8,107,663 | B2 * | 1/2012 | Lin | 381/371 |
| 2005/0072624 | A1 * | 4/2005 | Hwan Ryu et al. | 181/199 |
| 2005/0105755 | A1 * | 5/2005 | Yueh | 381/371 |
| 2006/0153414 | A1 * | 7/2006 | Liao | 381/371 |
| 2006/0272885 | A1 * | 12/2006 | Lee | 181/199 |
| 2008/0267438 | A1 * | 10/2008 | Chen et al. | 381/345 |
| 2009/0067658 | A1 * | 3/2009 | Lin | 381/345 |

* cited by examiner

HEADSET

BACKGROUND OF THE INVENTION

1. Field of the Invention

The present invention relates to a headset, and more particularly to a headset that allows a user to adjust the frequency response of the headset in use.

2. The Related Art

Headsets are widely applied in a variety of fields, such as telecommunication, computer based-telephony, audio entertainment and the like, providing audio information related to the application domain to a headset user. The headset connected with an electronic device transmits the audio signal from the electronic device to the ears of the headset user directly, rather than transmitting the sound by the air. Thus the user can hear clear sound from the electronic device, especially in some noisy and vociferous environments. Furthermore, the electronic device with the headset, taking MP3 for example, can be used at the user's will, without disturbing the ambient people. So the headset becomes more and more important and necessary for the users. Accordingly, the users with personal favor, have respective demands for the sound quality of the headsets. Since the frequency response of the headset has influence upon the sound quality of the headset, it is preferable for a headset of which the frequency response is adjustable to gain the desirable sound quality.

SUMMARY OF THE INVENTION

Accordingly, an object of the present invention is to provide a headset that allows a user to adjust the frequency response of the headset in use for gaining the desirable sound quality. The headset includes a housing having a first wall with at least one sound hole formed thereon, a loudspeaker unit disposed in the housing and adjacent to the sound hole, a blocking component mounted in the housing and capable of slidably moving towards and backwards the first wall to form an adjunctive chamber therebetween, and an adjustive component rotatably mounted to the housing. The adjustive component is connected with the blocking component in a way of screw link in order to drive the blocking component to move towards and backwards the first wall when the adjustive component is driven to rotate.

As described above, the headset is provided with the adjustive component to make the blocking component move along the predetermined directions, altering the volume of the chamber. Since the volume variation of the chamber has influence on the frequency response of the headset, the user can adjust the frequency response of the headset by rotating the adjustive component for gaining the desirable sound quality.

BRIEF DESCRIPTION OF THE DRAWINGS

The present invention will be apparent to those skilled in the art by reading the following description, with reference to the attached drawings, in which.

DETAILED DESCRIPTION OF THE EMBODIMENTS

Figure 1:
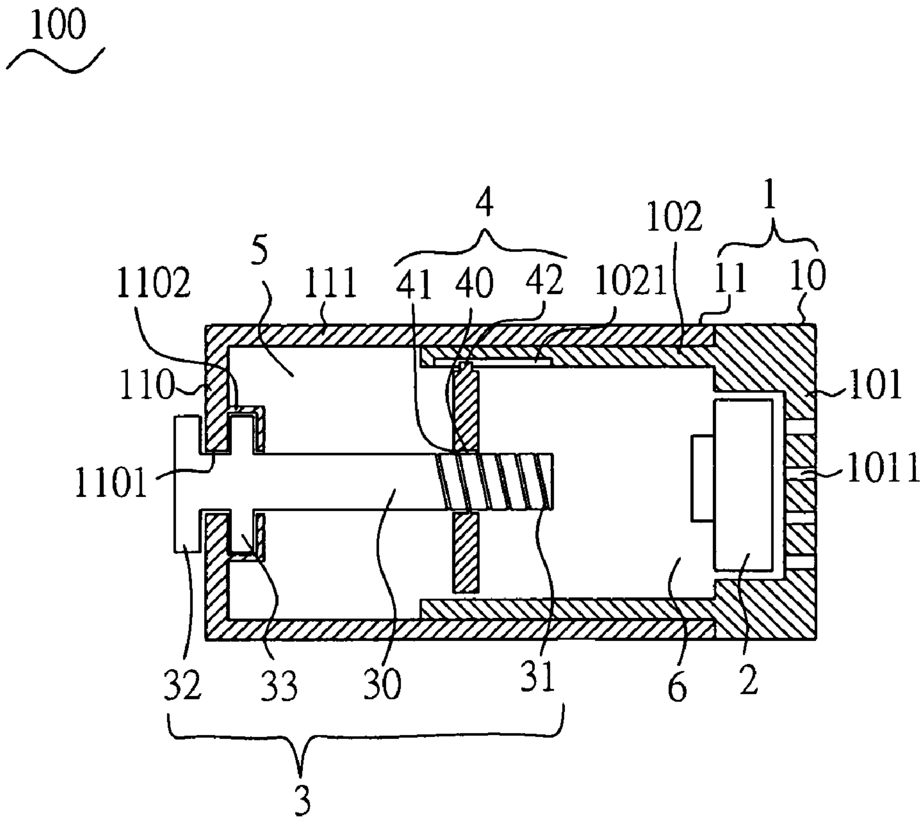
FIG. 1 is a sectional view of a headset of a first embodiment according to the present invention.

With reference to FIG. 1, a headset 100 of a first embodiment according to the present invention is shown. The headset 100 includes a housing 1, a loudspeaker unit 2, an adjustive component 3 and a blocking component 4. The housing 1 includes a front housing 10 and a rear housing 11 coupled with the front housing 10 to form a first chamber 5. The front housing 10 defines a first wall 101 and a second wall 102 extending rearwards perpendicularly from a surface of the first wall 101 to form a substantial laid-cup shape. The first wall 101 has a plurality of sound holes 1011 arranged at a center thereof for giving a sound off. The loudspeaker unit 2 is located in the first chamber 5 and disposed adjacent to the sound holes 1011. The rear housing 11 defines a third wall 1 10 facing the first wall 101 and a fourth wall 111 extending frontward perpendicularly from a surface of the third wall 110 to form a substantial laid-cup shape and enclosing a periphery of the second wall 102 to form the first chamber 5. The third wall 110 has an installing hole 1101 at a center thereof for mounting the adjustive component 3.

The adjustive component 3 includes a main body 30 of column shape and an adjustive switch 32 of circular flat-board shape connected to one end of the main body 30. The other end of the main body 30 is formed with a thread groove 31. The main body 30 passes through the installing hole 1101 of the third wall 110. The adjustive switch 32 is located outside the third wall 110 for conveniently manual operation and preventing the main body 30 from moving towards the first wall 101. In this embodiment, the main body 30 further has a protruding portion 33 enclosing a periphery thereof to show a substantial ring shape and away from the thread groove 31, and an inner surface of the third wall 110 has a portion extended inwards and bent towards the main body 30 to form a stopping portion 1102 of inverted-L shape as viewed in its cross section. The stopping portion 1102 surrounds the protruding portion 33 with the third wall 110 for preventing the adjustive component 3 from moving frontward and rearwards.

The blocking component 4 is slidably mounted in the first chamber 5, with the shape thereof depending on the shape of the first chamber 5. In this embodiment, the blocking component 4 is a circular flat board, and a peripheral edge of the blocking component 4 is extended outwards to form a sliding lump 42. Correspondingly, an inner surface of the second wall 102 has a sliding groove 1021 extending frontward and rearwards. The sliding lump 42 is inserted into and forced to slide in the sliding groove 1021 for making the blocking component 4 move in the first chamber 5 with respect to the first wall 101. The blocking component 4 further has a connecting hole 40 at the center thereof for allowing the main body 30 to pass therethrough. A surface of the connecting hole 40 is formed with a thread ridge 41 corresponding to the thread groove 31. The blocking component 4, the first wall 101 and the second wall 102 cooperatively form a second chamber 6 of which volume is altered according to the movement of the blocking component 4.

The adjustive switch 32, which is disposed outside the headset 100, rotates by means of turning to make the main body 30 rotate in the connecting hole 40, which will drive the blocking component 4 to move frontward or rearwards because the thread ridge 41 is engaged in the thread groove 31. Thus the volume of the second chamber 6 is altered accompanying with the movement of the blocking component 4, consequently, changing the frequency response of the headset 100.

Figure 2:
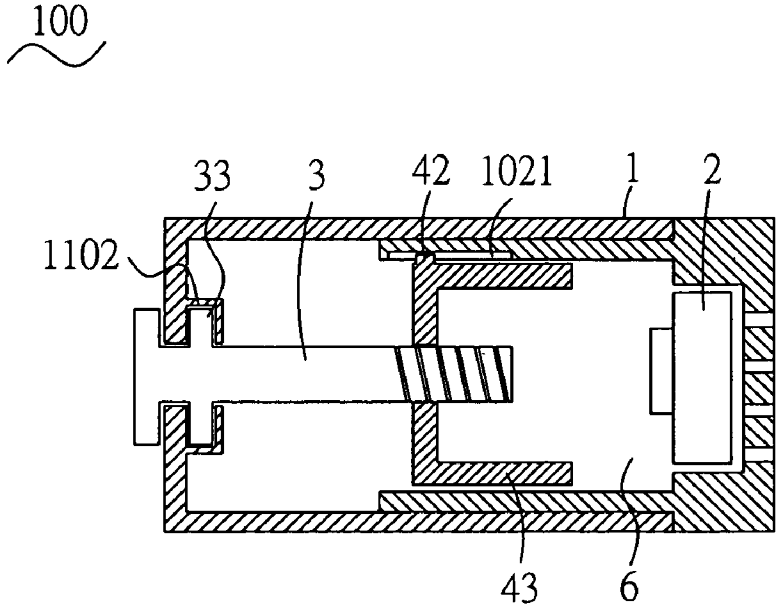
FIG. 2 is a sectional view of a headset of a second embodiment according to the present invention.

Please refer to FIG. 2, a headset 100 of a second embodiment according to the present invention is illustrated. In comparison with the first embodiment, the structure of the headset 100 according to the second embodiment is same as that of the headset 100 according to the first embodiment except for the blocking component 4. The blocking component 4 in the second embodiment further has an extending portion 43 extending towards the first wall 101 from a surface thereof. The extending portion 43 is cylindraceous and conjuncted with the blocking component 4 to show a laid-cup shape.

Figure 3:
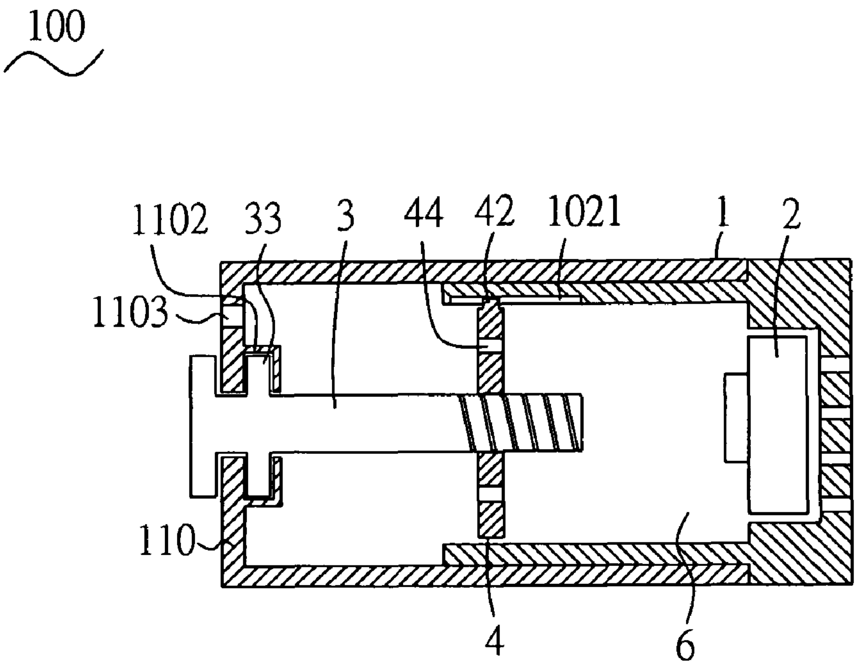
FIG. 3 is a sectional view of a headset of a third embodiment according to the present invention.

Please refer to FIG. 3, a headset 100 of a third embodiment according to the present invention is shown. In comparison with the first embodiment, the headset 100 according to the third embodiment further has a plurality of first holes 1103 arranged on the third wall 110 and a plurality of second holes 44 formed on the blocking component 4 for giving the sound off.

Figure 4:
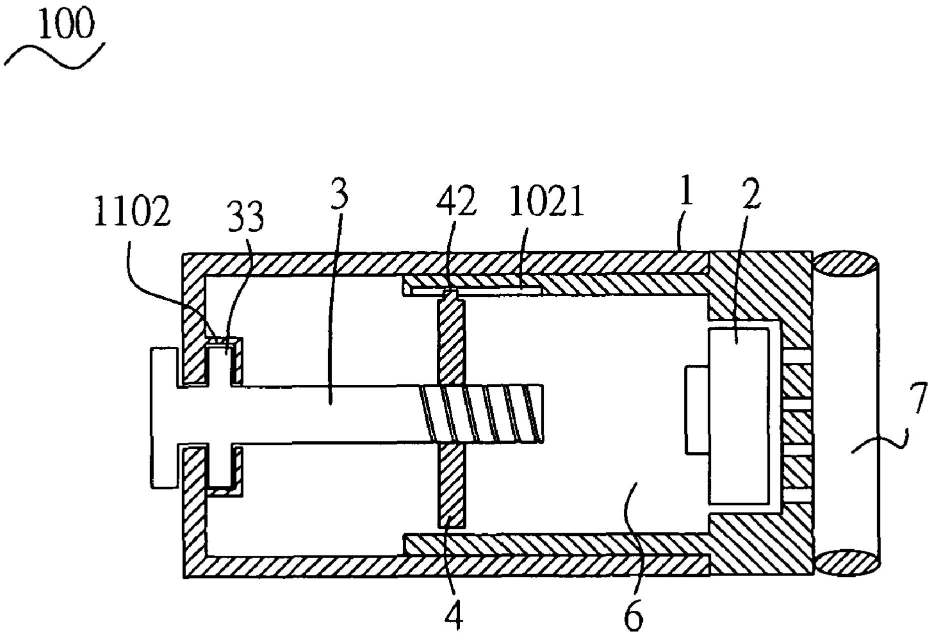
FIG. 4 is a sectional view of a headset of a fourth embodiment according to the present invention.
Figure 5:
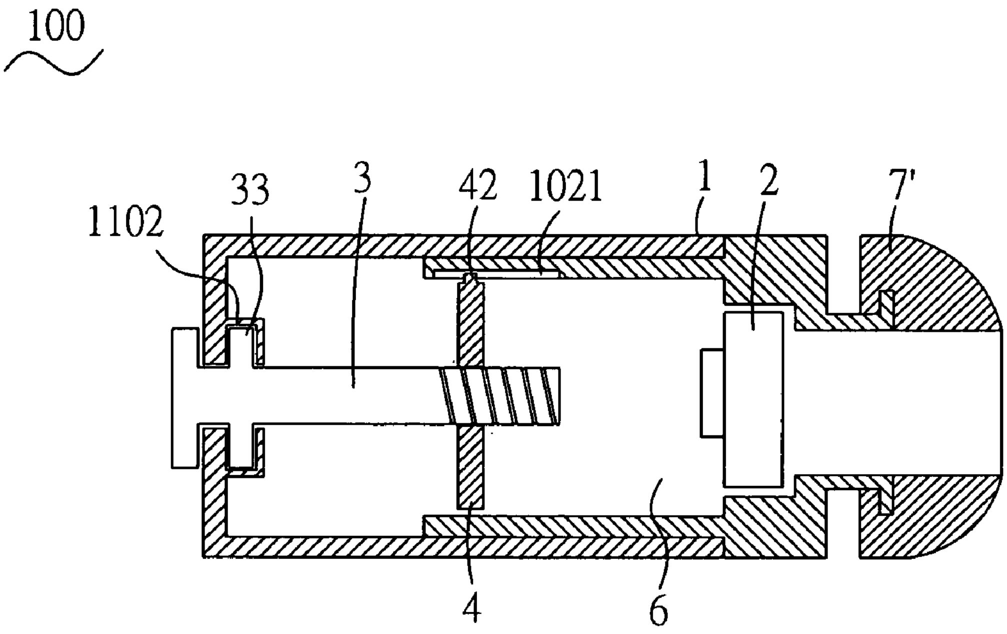
FIG. 5 is a sectional view of a headset of a fifth embodiment according to the present invention.
Figure 6:
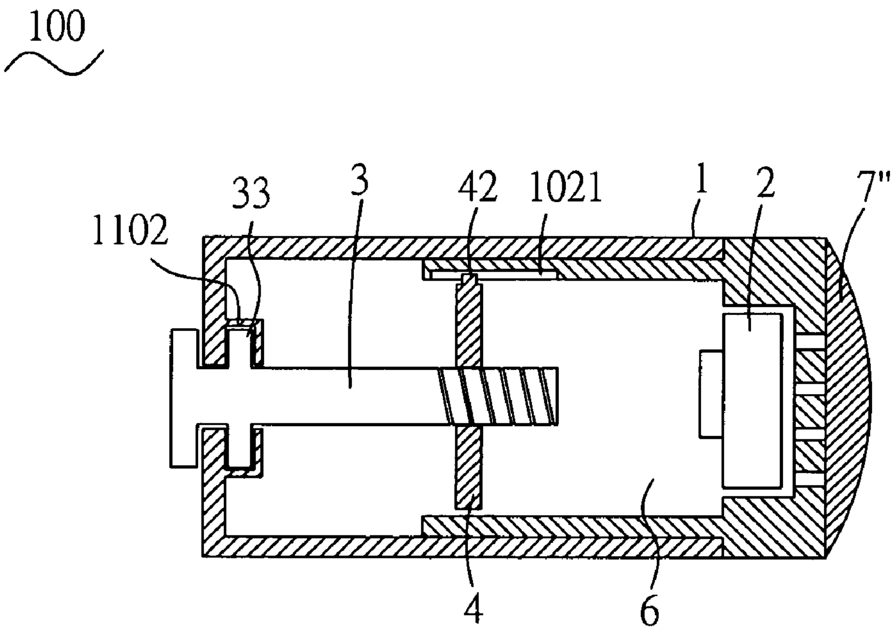
FIG. 6 is a sectional view of a headset of a sixth embodiment according to the present invention.

Referring to FIGS. 4-6, the headset 100 of a first embodiment according to the present invention can be supplied with multiple ear cushions, for example sponge cushion, to form multiple modes for meeting different demands. FIG. 4 is a sectional view showing the headset 100 equipped with an around-ear cushion 7, forming an around-ear headset. FIG. 5 is a sectional view showing the headset 100 equipped with an in-ear cushion 7', forming an in-ear headset, and FIG. 6 is a sectional view showing the headset 100 equipped with an on-ear cushion 7", forming an on-ear headset.

As described above, the headset 100 is provided with the adjustive component 3 to make the blocking component 4 move along the predetermined directions, capable of altering the volume of the second chamber 6. Since the volume variation of the second chamber 6 has influence on the frequency response of the headset 100, the user can adjust the frequency response of the headset 100 by rotating the adjustive switch 32 for gaining the desirable sound quality.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A headset, comprising:

a housing having a first wall with at least one sound hole formed thereon;

a loudspeaker unit disposed in the housing and adjacent to the sound hole;

a blocking component mounted in the housing and capable of slidably moving towards and backwards the first wall to form an adjunctive chamber therebetween; and an adjustive component rotatably mounted to the housing, the adjustive component connected with the blocking component in a way of screw link in order to drive the blocking component moving towards and backwards the first wall when the adjustive component is driven to rotate, wherein the adjustive component has a main body having a column shape, and comprising a thread groove and a protruding portion, the thread groove engaging with a corresponding thread ridge formed at a surface of a connecting hole defined at a substantial middle portion of the blocking component, an adjustive switch being disposed outside the housing and connected with an end of the main body away from the thread groove, the protruding portion enclosing the main body and located adjacent to the adjustive switch, a stopping portion formed on an inner surface of the housing, and extending inwards and bending towards the main body to surround the protruding portion.

2. The headset as claimed in claim 1, wherein the blocking component is a flat-board shape or a lain-cup shape.

3. The headset as claimed in claim 1, wherein the blocking component defines at least one first hole, a wall of the housing facing the first wall defines at least one second hole.

4. A headset, comprising a housing having a first wall with at least one sound hole formed thereon;

a loudspeaker unit disposed in the housing and adjacent to the sound hole;

a blocking component mounted in the housing and capable of slidably moving towards and backwards the first wall to form an adjunctive chamber therebetween; and an adjustive component rotatably mounted to the housing, the adjustive component connected with the blocking component in a way of screw link in order to drive the blocking component moving towards and backwards the first wall when the adjustive component is driven to rotate, wherein the housing has at least one sliding groove extending along a movement direction of the blocking component at an inner surface thereof, the blocking component has a corresponding sliding lump inserted and sliding in the sliding groove.

5. The headset as claimed in claim 4, wherein the housing comprises a front housing and a rear housing coupled with the front housing, the sliding groove is formed on an inner surface of the front housing and extends frontward and backwards.

6. The headset as claimed in claim 4, wherein the blocking component defines at least one first hole, a wall of the housing facing the first wall defines at least one second hole.

* * * * *